United States Patent
Sinha et al.

(10) Patent No.: US 11,861,464 B2
(45) Date of Patent: Jan. 2, 2024

(54) GRAPH DATA STRUCTURE FOR USING INTER-FEATURE DEPENDENCIES IN MACHINE-LEARNING

(71) Applicant: Adobe Inc., San Jose, CA (US)

(72) Inventors: Ritwik Sinha, Cupertino, CA (US); Sunny Dhamnani, Karnataka (IN)

(73) Assignee: Adobe Inc., San Jose, CA (US)

( * ) Notice: Subject to any disclaimer, the term of this patent is extended or adjusted under 35 U.S.C. 154(b) by 758 days.

(21) Appl. No.: 16/670,543

(22) Filed: Oct. 31, 2019

(65) Prior Publication Data
US 2021/0133612 A1 May 6, 2021

(51) Int. Cl.
*G06N 20/00* (2019.01)
*G06F 30/20* (2020.01)
*G06F 18/21* (2023.01)
*G06N 7/01* (2023.01)
*G06F 18/2113* (2023.01)

(52) U.S. Cl.
CPC ......... *G06N 20/00* (2019.01); *G06F 18/2113* (2023.01); *G06F 30/20* (2020.01); *G06N 7/01* (2023.01)

(58) Field of Classification Search
CPC .......... G06V 10/40; G06N 5/02; G06N 5/022; G06F 16/9024; G06F 16/282
See application file for complete search history.

(56) References Cited

U.S. PATENT DOCUMENTS

| | | | |
|---|---|---|---|
| 2007/0192264 A1* | 8/2007 | Hawkins | G06N 3/08 706/15 |
| 2007/0203870 A1* | 8/2007 | Saito | G06F 17/10 706/52 |
| 2015/0142853 A1* | 5/2015 | Tealdi | G06F 16/9024 707/798 |
| 2016/0357720 A1* | 12/2016 | Thimbleby | G06Q 10/101 |
| 2017/0091673 A1* | 3/2017 | Gupta | G06N 5/022 |
| 2019/0156153 A1* | 5/2019 | Can | G06F 18/24 |

(Continued)

OTHER PUBLICATIONS

Business Modeling Has Finally Evolved!, Available online at : https://whatif.io/, 2019, 5 pages.

(Continued)

*Primary Examiner* — Saba Dagnew
(74) *Attorney, Agent, or Firm* — Kilpatrick Townsend & Stockton LLP

(57) ABSTRACT

This disclosure involves generating graph data structures that model inter-feature dependencies for use with machine-learning models to predict end-user behavior. For example, a processing device receives an input dataset and a request to modify a first input feature of the input dataset. The processing device uses a graph data structure that models the inter-feature dependencies to modify the input dataset by propagating the modification of the first input feature to a second input feature dependent on the first input feature. The modification to the second input feature is a function of at least (a) the value of the first input feature and (b) a weight assigned to an edge linking the first input feature to the second input feature within the directed graph. The processing device then applies a trained machine-learning model to the modified input dataset to generate a prediction of an outcome.

17 Claims, 10 Drawing Sheets

(56) References Cited

U.S. PATENT DOCUMENTS

2019/0325352 A1* 10/2019 Tsai ............... G06F 16/282

OTHER PUBLICATIONS

Empirical Systems, Available online at: https://empirical.com/tech/, 2019, 1 page.
Breiman, Statistical Modeling: The Two Cultures (with comments and a rejoinder by the author), Statistical Science, vol. 16, No. 3, 2001, pp. 199-231.
Conrady, et al., Bayesian Networks and BayesiaLab: A Practical Introduction for Researchers, 2015, 383 pages.
Fei, et al., Learning Sparse Causal Gaussian Networks with Experimental Intervention: Regularization and Coordinate Descent, Journal of the American Statistical Association, vol. 108, No. 501, Mar. 15, 2013, pp. 288-300.
Fong, et al., Interpretable Explanations of Black Boxes by Meaningful Perturbation, Proceedings of the IEEE International Conference on Computer Vision (ICCV), 2017, 9 pages.
Gu, et al., Penalized Estimation of Directed Acyclic Graphs from Discrete Data, Statistics and Computing, vol. 29, No. 1, Jan. 2019, pp. 161-176.
Heinze-Deml, et al., Causal Structure Learning, Annual Review of Statistics and Its Application, vol. 5, Mar. 2018, pp. 372-391; arXiv:1706.09141 submitted Jun. 28, 2017, 30 pages.
Hernan, Causal Inference, Boca Raton: Chapman & Hall/CRC, forthcoming, Oct. 26, 2019, 310 pages.
Krause, et al., Interacting with Predictions: Visual Inspection of Black-box Machine Learning Models, Proceedings of the 2016 CHI Conference on Human Factors in Computing Systems, ACM, May 7-12, 2016, 12 pages.
Lim, et al., Improving Understanding and Trust with Intelligibility in Context-Aware Applications, May 2012, 478 pages.
Molnar, Interpretable machine learning. A Guide for Making Black Box Models Explainable, Available online at: https://christophm.github.io/interpretable-ml-book/, Oct. 20, 2019.
Pearl, Causal Inference, Proceedings of Workshop on Causality: Objectives and Assessment, PMLR vol. 6, 2010, pp. 39-58.
Zheng, et al., DAGs with No Tears: Continuous Optimization for Structure Learning, In proceedings of the Advances in Neural Information Processing Systems (NIPS), 2018, 12 pages.

* cited by examiner

GRAPH DATA STRUCTURE FOR USING INTER-FEATURE DEPENDENCIES IN MACHINE-LEARNING

TECHNICAL FIELD

This disclosure generally relates to artificial intelligence. More specifically, but not by way of limitation, this disclosure relates to generating data structures that simulate the inter-feature dependencies of datasets to generate datasets for input to machine-learning models.

BACKGROUND

Automated modeling systems are used for analyzing interactions with online services that provide digital forums in which end users may interact with online content (e.g., by purchasing products or services). Automated modeling systems use modeling algorithms that involve techniques such as logistic regression, neural networks, support vector machines, etc. These automated modeling algorithms are trained using training data, which can be generated by or otherwise indicate certain interactions, transactions, or circumstances. This training data is analyzed by one or more computing devices of an automated modeling system. The training data is grouped into predictor features, which are provided as inputs to an automated modeling algorithm in a training process. The training process configures the automated modeling algorithm to compute predictions or other analytical outputs from inputs representing circumstances similar to those represented by the predictor features used for training.

For example, the automated modeling system uses the predictor features to learn how to generate predictive outputs involving user interest or transactions (or other circumstances) that are similar to the predictor features from the training data. In one example, such an automated modeling system could predict the probability of a consumer action given a particular set of features passed as input. The automated modeling system could can also be used to attempt to increase the probability of consumer action by, for example, varying the value of one input feature to determine if a corresponding increase in the probability occurs.

Existing processes for training or using automated modeling systems often assume that input features are independent. Feature independence occurs if, for example, changes in the value of one input feature do not impact the value of a different input feature. These existing processes, by assuming the independence of input features, do not account for inter-feature dependencies of the features input to the automated modeling system.

Assuming this feature independence, however, may present disadvantages when using an automated modeling system to predict changes in output that may occur when varying test inputs. For example, an automated modeling system could uses multiple input features (e.g., web pages viewed, social media postings, clicks on certain search results) to predict values of an output (e.g., probability of completing an online transaction). A user of the automated modeling system may wish to simulate how a range of different values for an input feature of interest (e.g., web pages viewed) will impact the output values. To do so, the user may manually input different values for the input feature of interest. If feature independence is assumed, the automated modeling system may disregard the impact that manually modifying the input feature might have on other input features (e.g., changes in numbers of clicks on certain search results that vary with number of web page views). Thus, rather than computing a set of output values from modified values of both an input feature (changes in numbers of clicks on certain search results) and a dependent input feature (number of web page views), the automated modeling system will compute the set of output values from the manually modified value of one input feature and an unchanged value of the dependent input feature. Therefore, since changes in the dependent input feature are not reflected in the simulation, the automated modeling system may not accurately simulate how the output varies with the input feature of interest.

SUMMARY

Aspects of the present disclosure involve updating datasets for multivariate machine-learning simulations. For example, a processing device receives an input dataset that includes input features for a trained machine-learning model. The processing device modifies the input dataset for use by the trained machine-learning model, and applies the trained machine-learning model to the modified input dataset. To modify the input dataset for use by the trained machine-learning model, the processing device generates a directed graph that includes nodes that represent the input features and edges that link nodes. Each pair of nodes linked by an edge has a source node and a destination node with the input feature of the destination node being dependent on an input feature of the source node. The processing device defines a probability distribution indicating probabilities of the input feature of the destination node having potential destination values given the input feature of the source node having source values. The processing device selects a subset of potential destination values from the probability distribution. The processing device updates a weight of the edge between the source node and the destination node, where the updated weight represents a correlation between the subset of the potential destination values and a subset of the source values. The processing device updates the destination value of the input feature of the destination node. The destination value is computed from the value of the input feature of the source node and the updated weight.

These illustrative embodiments are mentioned not to limit or define the disclosure, but to provide examples to aid understanding thereof. Additional embodiments are discussed in the Detailed Description, and further description is provided there.

BRIEF DESCRIPTION OF THE DRAWINGS

Features, embodiments, and advantages of the present disclosure are better understood when the following Detailed Description is read with reference to the accompanying drawings.

DETAILED DESCRIPTION

Figure 1:
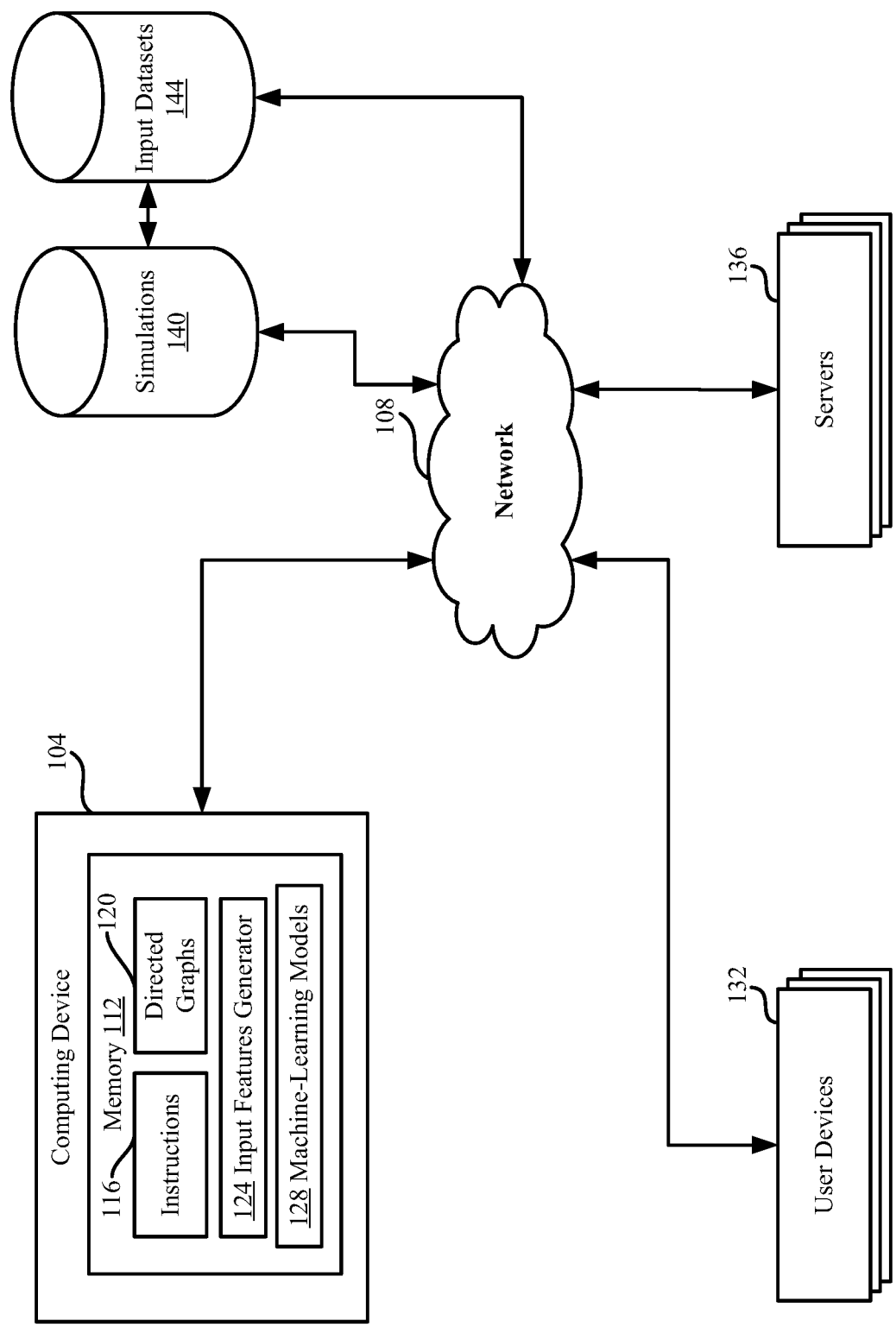
FIG. 1 depicts an example of a network environment for generating graph data structures for using inter-feature dependencies in machine-learning models, according to certain embodiments of the present disclosure.

The present disclosure involves using graph data structures that simulate the inter-feature dependencies of datasets to generate datasets for input to machine-learning models. As explained above, conventional solutions for using these machine-learning models (e.g., for predictive modeling of user behavior) are limited by failing to identify and use inter-feature dependence, which can reduce the accuracy of results obtained with these machine-learning models. Certain embodiments described herein improve the performance of automated modeling systems by, for example, generating graph data structures that use inter-feature dependencies to define input features for predictive models. For example, automated modeling systems described herein are used to generate a graph data structure, such as a directed acyclic graph, that models dependencies of features configured to be input into a machine-learning model. The graph data structure includes nodes that represent the input features and edges that link pairs of nodes indicating that an input feature of one node is dependent on the input feature of the other node. The automated modeling systems build predictive models by varying one or more input features and using the graph data structure to define the values for the remaining input features. The automated modeling systems then apply a trained machine-learning model to the input features to produce an accurate predictive output.

The following non-limiting example is provided to introduce certain embodiments. In this example, an automated modeling system includes one or more computing systems that use predictive modeling for marketing simulations. The predictive model takes, as input, a set of input features that corresponds to aspects of the simulation such as webpage visits, marketing emails, number and type of social media posts, and the like. The predictive model is applied to the set of input features to generate a predictive output such as a probability that users will perform an action such as acquire a particular product or service.

Continuing with this example, the automated modeling system generates a graph data structure that models the set of input features. The graph data structure could be, for example, a directed acyclic graph that is generated from an analysis of the input features. The graph data structure represents the input features as nodes. A given edge can link two nodes: a source node and a destination node. The destination node represents an input feature that has a value that is dependent on the value of an input feature of the source node. Each edge is assigned a weight, which indicates the degree to which the input feature of the destination node is dependent on the input feature of the source node. For instance, decreasing the social media posts associated with a product or service may have a large impact on webpage visits, whereas search advertisements may have a marginal impact on webpage visits. Therefore, an edge connecting a source node associated with social media to the destination node associated with webpage visits will have a larger weight as compared to an edge connecting a source node associated with search advertisement to the destination node associated with webpage visits.

An automated modeling system can use the graph data structure to account for interdependencies in various input features. For instance, the automated modeling system could simulate marketing scenarios using the graph data structure with a predictive model. The set of input features are passed to the predictive model to provide a predictive result. For instance, the values of the input features can correspond to the current marketing inputs such that the predictive model outputs what is already known regarding users prevalence for acquiring the particular product or service. In a simulation, a first marketing scenario determines whether changes in the prediction will occur if the number of emails transmitted are increased 100% and the number of search advertisements are decreased 50%. Simply modifying two input features independently, will cause the predictive model to output an inaccurate result.

To avoid this inaccurate result, the automated modeling system can use the graph data structure to propagate a change to a first input feature to those input features that depend on the first input feature. The graph data structure defines updated values for the dependent input features based on the values of the modified input features and the edge weights linking the input features. For instance, increasing the number of emails transmitted will cause a proportional increase in the number of webpage visits. By representing this dependency via the graph data structure, the automated modeling system can, for example, respond to a manual modification of the "number of emails transmitted" input feature by automatically modifying the "number of webpage visits" input feature. The automated modeling system can apply the predictive model to these modified values of the "number of emails transmitted" input feature and the "number of webpage visits" input feature, thereby obtaining a more accurate predictive output than would be computed if these two input features were assumed to be independent of one another.

Thus, after the automated modeling systems generates an updated set of input features using feature dependencies modeled by the graph data structure, the automated modeling system applies the predictive model to the updated set of input features. The predictive model thereby generates a more accurate predictive output using the updated input features. In this example, the predictive model generates an indication as to whether the modifications to the one or more input features will increase or decrease the probability that users will acquire the particular product or service.

In some embodiments, the edge weights that represent dependencies between different input features are computed using suitable probability techniques. In one example, a computing system that builds the graph data structure is used to define a probability distribution. The probability distribution indicates probabilities of an input feature of a destination node having potential destination values given the input feature of the source node having source values. For example, a second node (e.g., destination node) corresponding to webpage visits depends on a source value of a first node (e.g., source node) corresponding to social media posts as some users are likely to visit the webpage after seeing social media posts. Increasing social media posts will increase webpage visits. The probability distribution associated with webpage visits indicates a probability for each possible number of webpage visits (e.g., destination value) given a particular number of social media posts (e.g., source value). The probability can be determined from the input dataset or from historical datasets.

For example, the input dataset (and/or a historical dataset) provides various values of the input features including the webpage visits and social media posts that are observed (e.g., either contemporaneously or historically). For instance, as observed from the data, the webpage has received 1000 visits in a month when the current number of social media posts was also 1000 within the same time interval. In addition, as observed from the data, the webpage has received 2000 visits when the current number of social media posts was 1500. The processing device extrapolates these values to determine a probability that the webpage visits will be 1001, 1002, ... etc. given a particular value of the social media posts. For instance, if the social media posts is 1000, the webpage visits between 750 and 1250 (e.g., the values close to 1000) will have high probabilities in the probability distribution. Webpage visits 500-749 and 1251-1500 (e.g., further away from 1000) will have lower probability values and webpage visits below 500 or above 1500 will have extremely low probability values. In other words, the values that are closer to an observed data point (e.g., 1000) for the given source value (e.g., also 1000) will have a higher likelihood of occurring than those values further away.

The computing system determines that a subset of potential destination values have a probability that exceeds a probability threshold. The probability threshold is set to separate those destination values that are likely to occur from those that are not. For instance, the probability threshold is 0.8 to ensure that only those webpage visits values that have 80% probability of occurring will be added to the subset of potential destination values while values that are less likely to occur will be omitted. The computing system selects the subset of potential destination values based on these values exceeding the probability threshold. The computing system uses the selected subset to update a weight of the edge between the source node and the destination node. For example, the computing system computes an updated weight from a correlation between the subset of the potential destination values and a subset of the source values.

As used herein, the term "input feature" is used to refer to any data point that is configured to be input into a machine-learning model. Input features can correspond to aspects of a marketing scenario. Examples of these input features include, but are not limited to, webpage visits, emails transmitted (e.g., marketing emails or emails that are associated with a product or service), social media posts (e.g., frequency of posts or posts corresponding to a particular subject), direct advertisements, search advertisements, web based advertisements, other webpages (e.g., those associated with a particular product or service), searches associated with a particular product or service, etc. In some embodiments, a value of an input feature is determined, in part, by a graph data structure that models inter-feature dependencies of the input features.

As used herein, the term "simulation" is used to refer to an application of a predictive model to a set of input features to produce a predictive outcome. A system, such as a marketing system associated with a product or service, is represented by the set of feature points. The predictive model simulates the system by generating a prediction of an outcome that will result given the set of input features.

As used herein, the term "scenario" is used to refer to any modification to one or more input features of a simulation to predict an outcome that will result from the modification. A scenario is an interventional process. Scenarios can be used to determine how modifications to the input features will affect the predicted outcome. Scenarios can also be used for sensitivity analysis input that determines a degree in which input features affects the predicted outcome. Sensitivity analysis can include ranking the input features based on the degree in which input features affects the predicted outcome.

Certain embodiments described herein facilitate the improved performance of machine-learning models. For instance, these embodiments can be used to define input features for machine-learning models that predict the behaviors of consumers or other end users. Examples of predicted behaviors include a conversion of a prospective consumer, a defection of an existing consumer, positive or negative feedback about electronic content available via an online service (e.g., content describing a brand on a social media website), number of purchases in a particular time interval (e.g., weekly, monthly, etc.), etc. In some embodiments, relationship management tools are used to assess the value of certain consumers based on these predicted behaviors. The predicted behaviors, the assigned values, or both allow a user of the relationship management tool to take appropriate action in response to a certain prediction (e.g., changing a salesperson's response to a consumer's inquiry if the conversation indicates an expression of concern rather than an expression of interest). Scenarios are defined by varying one or more input features of a set of input features. The scenarios predict how the behaviors of consumers or other end users will change as a result of modifying the one or more input features.

Example of an Operating Environment for Generating a Graph Data Structure

Referring now to the drawings, FIG. 1 depicts an example of a network environment for generating graph data structures for using inter-feature dependencies in machine-learning models, according to certain embodiments of the present disclosure. In the example depicted in FIG. 1, processing device 104 receives marketing data from remote sources via network 108 and generates various simulations of the versions of the marketing data to determine a particular, desirable outcome. For instance, a baseline simulation of the marketing system includes applying a predictive model to the marketing data to predict the outcome associated with product or service, such as number of purchases or purchase by a particular end user, etc. Processing device 104 simulates alternative scenarios to the baseline simulation in which one or more data points of the marketing data are modified to predict how varying the one or more data points can increase or decrease the likelihood of a particular outcome. Processing device 104 generates additional scenarios that include different values for one or more other data points to maximize or minimize the likelihood of the particular outcome. The modified data points are then implemented within a marketing system to increase (or decrease) the predict outcome.

Processing device 104 includes memory 112 that stores program instructions 116 for generating scenarios of a system. Program instructions 116 include discrete functions and/or applications that are executed to define scenarios and execute simulations. Program instructions 116 include instruction that receive marketing data and parse the marketing data to define input features for a predictive model. For instance, marketing data can include structured and unstructured data that represent various data and data points of the system. Program instructions 116 parse the data marketing data to determine input features and their values for the predictive model.

Program instructions 116 include instructions that generate graph data structures 120 using the input features. Graph data structures model inter-feature dependencies of the input features to represent the relationship between the values of various input features. The graph data structure represents input features as nodes that are linked by edges. An edge links a source node to a destination node and indicates that the value of the input feature represented by the destination is dependent on the value of the input feature of the source node. Edges include a weight that indicates a degree of dependence between the source node and the destination node. The weight is defined using current and historical marketing data in which correlations between input features can be observed. In some instances, the graph data structure is generated using structured learning with continuous optimization.

Input features generator 124 defines an updated set of input features for a particular scenario. Input features generator 124 receives input for the particular scenario that includes a modification to one or more input features of baseline simulation. Input features generator 124 generates an updated set of input features by using the graph data structure 120 to propagate the modifications to the one or more input features to those input features dependent on the modified input features. Machine-learning model 128 is a predictive model that predicts an outcome given a set of input features. Machine-learning model 128 simulates the scenario using the updated set of input features and predicts the outcome. The outcome indicates an effect of modifying the one or more input features on the baseline simulation. For instance, the simulation of the scenario determines whether modifying the one or more input features predicts an increase or decrease in the likelihood of a particular outcome. Input features generator 124 can generate sets of input features for multiple related scenarios to identify a set of input features that maximizes or minimizes the outcome. The baseline simulation and the simulation of the scenario are stored in simulations 140 for later retrieval and further processing.

Some embodiments of the network environment 100 include user devices 132. Examples of a user device include, but are not limited to, a personal computer, a tablet computer, a desktop computer, a processing unit, any combination of these devices, or any other suitable device having one or more processors. One or more data points of the marketing data are received from instrumentation or analytics that execute on user devices 132. For instance, user interaction with a display advertisement can be captured by the user device and transmitted to processing device 104 or stored in input datasets 144 (e.g., a database or other storage medium).

Servers 136 direct the operation of processing device 104 and other processing devices (not shown). For instance, servers 136 manage input datasets 144 received from various sources including user devices 132. Servers 136 transmit requests to processing device 104 for particular simulations and/or scenarios. The requests include an identification of a set of marketing data and a definition of the simulation and/or scenario. The processing device 104 obtains the set of marketing data (e.g., from local storage or from input datasets 144) and executes the simulation and/or scenario. Processing device 104 transmits the results of the simulation and/or scenario to servers 136 via network 108. Servers 136 may direct one or more other processing devices (not shown) to process marketing data in parallel with processing device 104 or servers 136 may direct the one or more other processing devices to operate with processing device 104 to process marketing data in a distributed process.

Simulations 140 is a database that stores historical simulations performed by processing device 104. Each simulation stored in simulations 140 includes an identification of the marketing data used to define and run the simulation enabling the simulation to be rerun by processing device 104. The simulations stored in simulations 140 can be used as baselines for scenario executed by processing device 104. For instance, a new scenario predicts a particular likelihood that a user will acquire a good or service. A baseline simulation that corresponds to the same or similar marketing data is obtained from simulations 140 and used as a point of comparison. Processing device 104 or servers 136 compares the results of the new scenario with the baseline simulation to determine a degree in which the scenario altered the baseline simulation.

User devices 132, servers 136, simulations 140, and input datasets 144 are communicatively coupled to processing device 104 via network 108. Examples of network 102 include, but are not limited to, Internet, local area networks ("LAN"), wireless area networks, personal area networks, wide area networks, and the like.

As described in detail with respect to the various examples below, graph data structure 120 is used to improve the output of machine-learning model 128 according to various embodiments. The machine-learning model 128 is used to predict outcomes such as product purchases or consumer behavior. For illustrative purposes, the machine-learning model 128 described herein are described using simplified examples involving consumers, sales personnel, and sales journey. But the operations described herein can be applied to any automated modeling system that defines alternative scenarios for machine-learning model 128.

Figure 2:
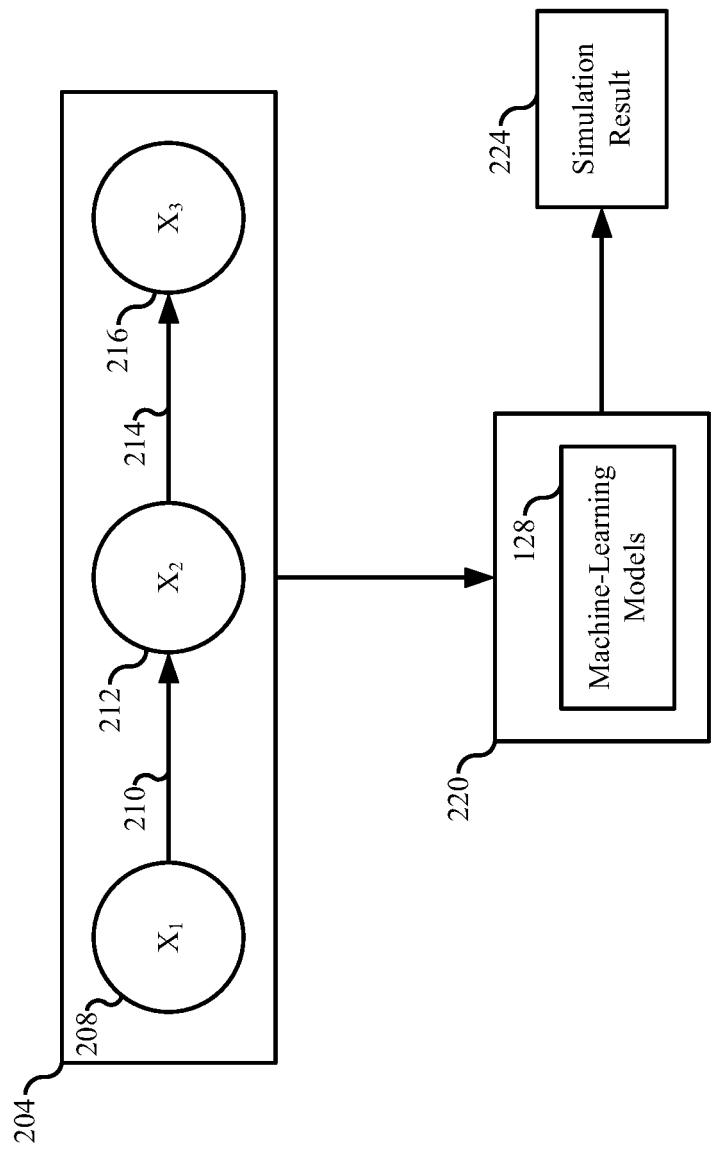
FIG. 2 depicts an example of a graph data structure that models inter-feature dependencies for machine-learning based predictions, according to certain embodiments of the present disclosure.

FIG. 2 depicts an example of a graph data structure that models inter-feature dependencies for machine-learning based predictions, according to certain embodiments of the present disclosure. The input features of a simulation are modeled by a graph data structure that represents the inter-feature dependencies of the input features. The graph data structure represents each input feature as a node. Edges connect pairs of nodes together. Edges are directed indicating one node of the pair (e.g., the destination node) is dependent on the other node (e.g., the source node). Edges are assigned a weight that indicates a degree in which the destination node is dependent on the source node.

Graph data structure 204 includes three input features: $X_1$ 208, $X_2$ 212, and $X_3$ 216. Edge 210 connects $X_1$ 208 to input feature $X_2$ 212 indicating that the value of $X_2$ 212 is dependent on the value of $X_1$ 208. Edge 214 connects $X_2$ 212 to input feature $X_3$ 216 indicating that the value of $X_3$ 216 is dependent on the value of $X_2$ 212. The process device assigns a weight $w_{i,j}$ (e.g., where i identifies the source node and j identifies the destination node) that indicates the degree of dependence between the source node and the destination node.

Simulator 220 executes the simulation by applying machine-learning model 128 to the input features to predict an outcome y=M(X) (e.g., simulation result 220). In some instances, simulator 220 is software executing within a processing device such as processing device 104 of FIG. 1. In other instances, simulator is a hardware platform (e.g., a processing device, system-on-chip, FPGA, etc.). Simulating a scenario includes varying one or more of $X_1$ 208, $X_2$ 212, and $X_3$ 216 and predicting an updated outcome y'=M(X'). Since the input feature are not independent, modifying one input feature will cause machine-learning model 128 to predict in inaccurate or incorrect outcome. For instance, the predictive model, y=M(X), predicts the number of products purchased weekly, where $X_1$ 208 represents a number of promotional emails transmitted to users, $X_2$ 212 represents display advertisements, and $X_3$ 216 represents a number of webpage visits. Increasing the number of promotional emails will likely increase the number of webpage visits in addition potentially increasing the number of products purchased. The increase in $X_1$ 208 will render the value of $X_3$ 216 invalid if not also modified.

Simulator 220 uses graph data structure 204 to exploit the inter-feature dependencies and generate values for the input features that accurately reflect a given scenario. The modifications are propagated to dependent input features to update the value assigned to those input features. The modification is based on the weight of the edge connecting the input features. For instance, the input features can be represented by $f(X_1)$, $f(X_2|X_1)$, and $f(X_3|X_2)$. If $X_1$ 208 is modified to be $X_1=X_1+\Delta X_1$ the modification is propagated to $X_2$ 212 as $X_2=X_2+w_{12}\Delta X_1$ and $X_3$ 216 as $X_3=X_3+w_{23}\Delta X_2$ where $\Delta X_2=w_{12}\Delta X_1$. If $X_2$ 212 is modified instead, the modification will only propagate to $X_3$ 216 since $X_1$ 208 is not dependent on $X_2$ 212.

For illustrative purposes, FIG. 2 depicts a graph data structure 204 that includes three input features. Graph data structure 204 can include any number of input features provided that the graph data structure is acyclic. In addition, a source node may be linked to zero or more destination nodes and a destination may be linked to zero or more source nodes.

In some embodiments, simulator 220 provides, or is included in, a simulation software tool for simulation of certain events (e.g., probability of a user taking a certain action). Such a software tool can include the simulator 220 and a user interface engine. The user interface engine can include code that, when executed by one or more processing devices, configures one or more input/output device (e.g., a touchscreen, a monitor and keyboard, etc.) to present a simulation interface. The simulation interface can include graphical interface elements for inputting and/or displaying values of input features of a machine-learning model. Examples of these graphical interface elements include a set of fields for inputting and/or displaying values of input features.

Each of these graphical interface elements can include one or more simulation event listeners. The simulation event listener detects events, such as data entry in certain fields or menu selections, that are used to set one or more values of input features that are used in a particular simulation performed by the simulator 220 with a machine-learning model 232. The user interface engine can also present, in a graphical interface, one or more interface elements (e.g., menus, pop-up dialogs, etc.) that allow an input device to manually specify, select, or otherwise input values of input features.

The user interface engine detects one or more modifications to input features (i.e., a simulation parameter) using a simulation event listener. The simulation event listener can identify which input feature is modified by the input and provide this information to the simulator 220. The simulator 220 can use the identified input feature to reference a corresponding node of the graph data structure 204 and thereby determine any feature dependencies with respect to the identified input feature. The simulator 220 can thereby compute any corresponding changes to one or more other input features for use by a simulation. In some embodiments, the simulator 220 can also instruct the user interface engine to update the user interface to display these corresponding changes to other input features (e.g., by updating the relevant graphical interface elements for inputting and/or displaying values of input features.

These embodiments can provide improvements to software tools for performing simulations. For example, as described above, conventional automated modeling techniques may be unable to effectively manage simulation scenarios that involve interdependent input features. Since users of conventional tools are therefore required to manually track dependencies and modify various input feature values in order to perform a simulation, the effectiveness of conventional simulation tools is undercut by these burdensome, time-consuming manual modifications. By contrast, the embodiments described above solve this problem with simulation software tools by providing an intuitive, user-friendly interface in which a user is only required to modify an input feature of interest, with the graph data structure being used to identify and apply feature dependencies in a manner that is transparent to the user. Such an improvement can allow automated modeling systems to rapidly and accurately simulate certain scenarios while reducing users' manual efforts (and associated errors in the application of a machine-learning model).

Figure 3:
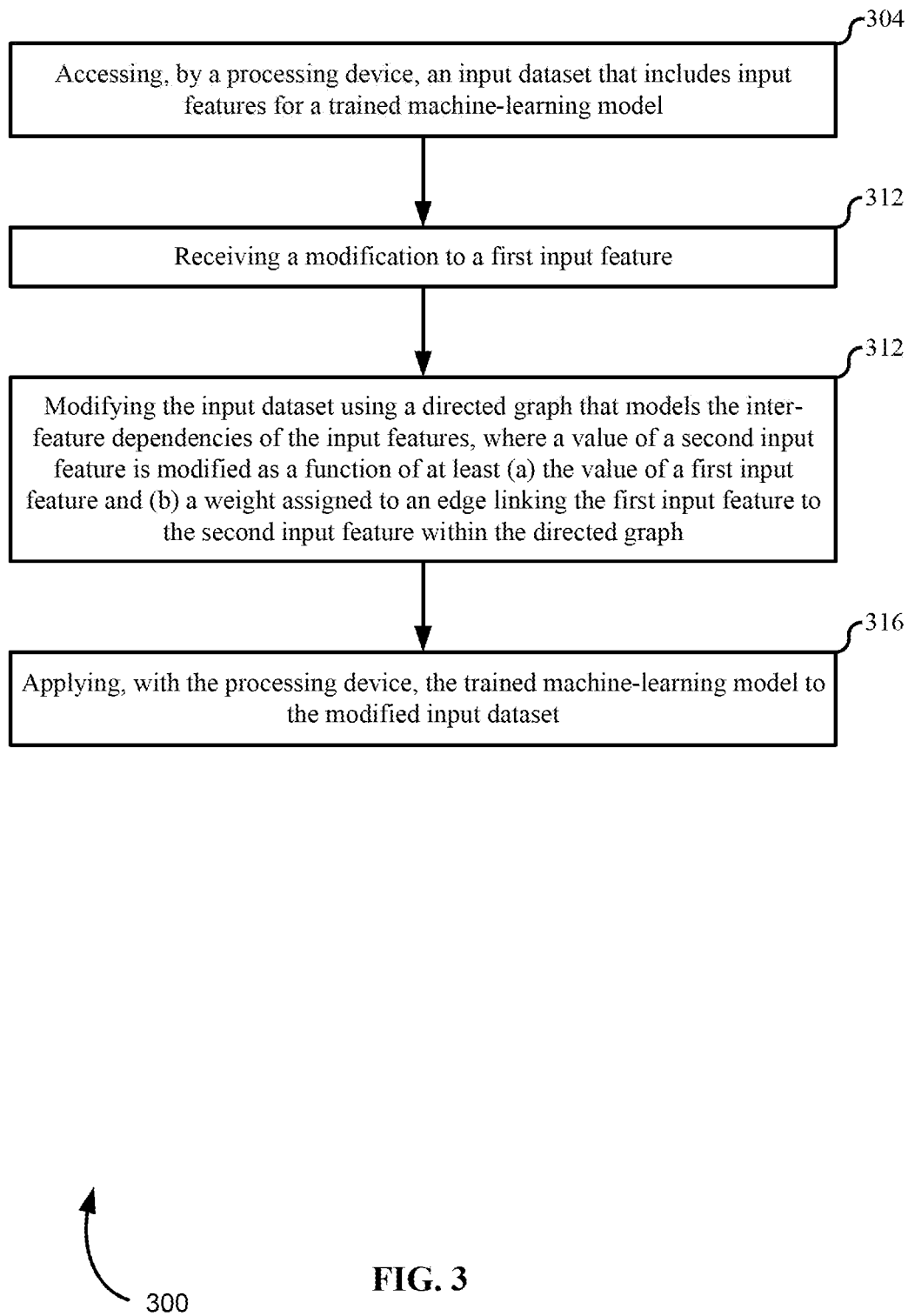
FIG. 3 depicts an example of a process for generating the graph data structure of FIG. 2, according to certain embodiments of the present disclosure.

The graph data structure 204 can be generated using one or more operations described herein. FIG. 3 depicts an example of a process for generating the graph data structure of FIG. 2, according to certain embodiments of the present disclosure. In some embodiments, one or more processing devices implement operations depicted in FIG. 3 by executing suitable program code. For illustrative purposes, the process 300 is described with reference to certain examples depicted in the figures. Other implementations, however, are possible.

At block 304, the process 300 involves accessing, by a processing device, an input dataset that includes input features for a trained machine-learning model. The input dataset can be accessed from local sources (e.g., local memory or locally connected storage devices) or remote sources (e.g., databases, servers, user devices, etc.). The processing device can run simulations using input features of input datasets. The simulation includes applying a machine-learning model to the input features to predict an outcome. For instance, the input dataset corresponds to marketing data from which the processing device runs simulations that predict average purchases over a time interval or user behavior.

At block 308, the processing device receives a request to modify a first input feature. The processing device simulates alternative scenarios by modifying one or more input features and predicting a new outcome. The new outcome is compared to the previous outcome to determine a change in outcomes (e.g., a delta) that results from modifying the one or more input features. Alternative scenarios are defined by the processing device automatically or by user input received from an input/output device or from a remote device over a network.

At block 312, the processing device modifies a second input feature of the input dataset based on the modification to the first input feature. Since the values of input features can be dependent on the values of other input features, a modification to one input feature of a dataset will cause some input features to have invalid values. If the predictive model is applied to these input features the predicted outcome will be less accurate or incorrect. The processing device uses a directed graph to model the inter-feature dependencies of the input dataset. The directed graph indicates which input features are dependent on other input features as well as a degree in which each input feature is dependent on another input feature. In some embodiments, the directed graph is received with the input dataset or from another source.

In other embodiments, the processing device generates the directed graph using, for example, structured learning, a linear structural causal model, or the like. For instance, the processing device can use the input dataset and historical dataset to observe correlations between the values of pairs of input features. The processing device initializes an empty directed graph, then adds each feature set. The processing devices then iteratively adds, removes, or reverses an edge between two input features. With each iteration, the processing device computes a score of the resulting directed graph. For instance, the score of the directed graph increases when an edge connecting a source node to a destination is added, while the score of the directed graph decreases when an edge connecting two uncorrelated nodes is added. If the score increases, the addition, removal, or reversal of the edge during that iteration is maintained. If the score decreases, the addition, removal, or reversal of the edge during that iteration is omitted. The processing device continues to interactively add, remove, or reverse edges until a particular score threshold is reached or until the score can no longer be increased.

Alternatively, a processing device uses a loss function that accounts for the least square loss between the estimated data (e.g., the directed graph) and the actual data of the input dataset. A smooth directed acyclic graph constraint can be applied during building of the directed graph to smooth and continuously optimize the directed graph. The directed graph can then be generated using gradient decent-based approaches. The processing device assigns weights to each edge to indicate a degree of dependence between the source node and the destination. The weights can be determined by the correlations observed from the input dataset and/or historical dataset.

The processing device uses the directed graph to determine updated input values for other input features resulting from the modification to the first input feature. For instance, the first input feature corresponds to search advertising and the second input feature corresponds to a number of webpage visitors. If search advertising is increased there will be an increase in the number of webpage visitors. The directed graph models these inter-feature dependencies and enables the processing device to use the directed graph to identify input features dependent on the first input feature and propagates the modification of the first input feature to the dependent input features. The modification to the dependent input features (e.g., the second input feature) is a function of at least (a) the modification of the first input feature and (b) a weight assigned to an edge linking the first input feature to the second input feature within the directed graph.

The processing device executes control code to implement blocks 304-308. For example, the control code of the processing is stored in a non-transitory computer-readable medium and is executed by one or more processing devices. Executing the control code causes the processing device to access the input datasets from the same non-transitory computer-readable medium or a different non-transitory computer-readable medium. In some embodiments, accessing the input datasets includes communicating, via a data bus, suitable signals between a local non-transitory computer-readable medium and the processing device. In additional or alternative embodiments, accessing the input datasets involves communicating, via a data network, suitable signals between a computing system that includes the non-transitory computer-readable medium and a computing system that includes the processing device.

At block 316, the process 300 involves applying a trained machine-learning model to the modified input dataset. The trained machine-learning model predicts an outcome based on the modified input dataset. In some embodiments, the processing device generates a sequence of modified input datasets with each modified input dataset including different values for the input features. The processing device applies the trained machine-learning model to each modified input dataset in the sequence to predict a corresponding sequence of outputs. The processing device compares the sequence of outputs and identifies values for the input features that correspond to a deliverable outcome (e.g., that predicts an increase in the number of weekly purchases). The processing device outputs the outcome (or sequence of outcomes) and an indication as to whether the modification to the first input feature increased or decreased the probability of the outcome. Examples of the output include transmitting the output to a remote device, storing the output in local and/or remote memory, displaying the output within a graphical user interface (e.g., alone or in a side-by-side presentation with another output), etc.

In an illustrative example involving an average number of weekly sales of a particular product, the observable input features include, frequency/volume of advertisements (e.g., search, printed, web-based, direct, etc.), number of webpage visits, social media associated with the particular product, promotional emails, number of visits or similar types of products, etc. The processing device applies the machine-learning model to the current observable input features to predict a baseline outcome. In this example, the baseline example, is the average number of weekly sales of the particular product. In some embodiments, the baseline outcome corresponds to the real-world outcome since the input features correspond to observable input features.

The processing device receives a request to modify the value of a first input feature corresponding to the number of promotional emails to predict an outcome (e.g., an increase or decrease to the number of weekly sales of the particular product). The other input features may be dependent on the first input feature such that the increase in promotional emails would result in an observable increase of the number of webpage visits by a first amount, increase social media posts associated with the particular product by a second amount, and decrease webpage visits to related webpages by a third amount. The directed graph captures these inter-feature decencies. The processing device propagates the modification to the first input feature to the other input features generating a modified set of input features. The processing device applies the machine-learning model to the modified set of input features to predict an updated outcome that would result in the modification to the one or more input features. For instance, the processing device, using the machine-learning model, predicts that increasing proportional emails increases the average weekly sales by 2%.

For illustrative purposes, FIG. 3 and the accompanying description above refer to first and second input features. But implementations with any number of input features are possible. The directed graphs of FIG. 4 and FIG. 7 described below illustrate directed graphs representing larger quantities of input features.

Figure 4:
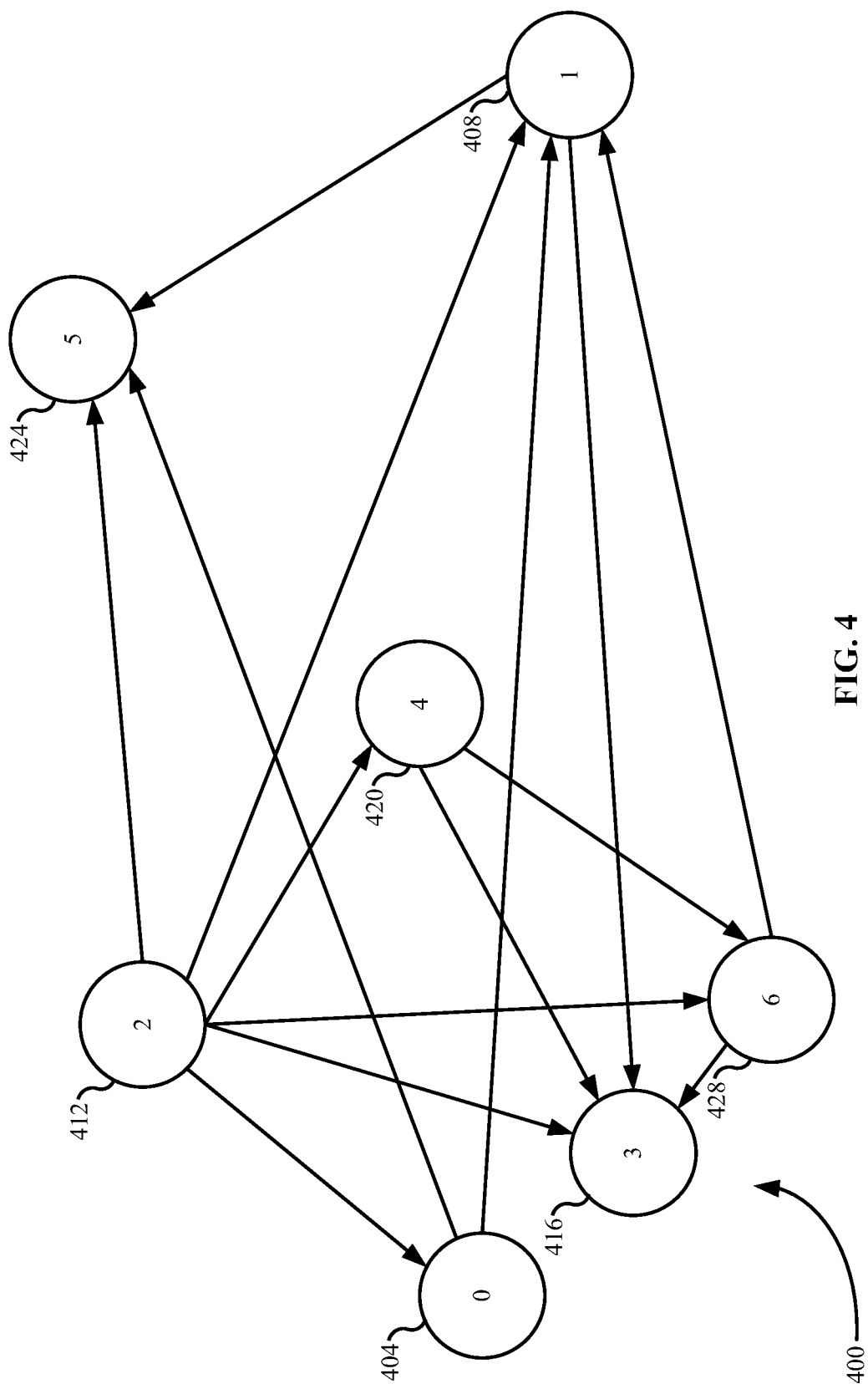
FIG. 4 depicts an example of graph data structure that models the inter-feature dependencies of a set of input features, according to certain embodiments of the present disclosure.

FIG. 4 depicts an example of graph data structure that models the inter-feature dependencies of a set of input features, according to certain embodiments of the present disclosure. Graph data structure 400 is a directed acyclic graph that includes seven nodes each of which represents an input feature. The nodes of graph data structure 400 include various dependencies on other nodes. Graph data structure 400 link pairs of nodes using directed edges. Directed edges indicate that a value of a second node (e.g., a destination node) is dependent on a value of a first node (e.g., a source node) with the degree of dependency represented by an edge weight (not shown). Directed edges are depicted in FIG. 4 as arrows with an arrow pointing from the source node and to the destination.

Graph data structure 400 models the inter-feature dependencies of the seven input features. For instance, node 404 is linked to node 424 and node 408 in which node 404 is a source node and node 424 and node 408 are destination nodes. Node 408 is linked to node 424 and node 416 in which node 408 is a source node and node 424 and node 416 are destination nodes. Since the graph is acyclic (e.g., no feedback loops), the value of dependent input features terminate in a finite number of iterations. For instance, the value of node 404 does not depend on other nodes and can be represented by a probability distribution $p(N_0)$. The value of node 408 depends on the value of node 404, node 412, and node 416 and can be represented by the probability distribution $p(N_1|N_0, N_2, N_6)$. The processing device uses the graph and the input dataset to define a probability distribution for each node such as: node 404 $p(N_0)$, node 408 as $p(N_1|N_0, N_2, N_6)$, node 412 as $p(N_2)$, node 416 as $p(N_3|N_1, N_2, N_4, N_6)$, node 420 as $p(N_4|N_2)$, node 424 as $p(N_4|N_0, N_1, N_2)$, and node 6 as $p(N_6|N_2, N_4)$. The combined probability distribution $p(N)$ is equal to $p(N_0)p(N_1)p(N_2)p(N_3)p(N_4)p(N_5)p(N_6)$.

The probability distributions represent a probability that an input feature will have a particular value. For dependent nodes, it is the probability that an input feature will have a particular value given a particular value of the one or more source nodes from which it depends. A processing device defines an initial probability distribution for each input feature assuming independence from other input features and based on the input dataset and/or historical datasets. The processing device uses the graph data structure (or some other dependency analysis) to qualify the probability distribution of dependent input features to account for the dependencies.

The processing device uses the probability distribution of the input features to refine weights assigned to each edge. The processing device generates a weighting dataset by sampling the probability distribution of input features that are independent (e.g., node 404 and node 412) to define a set of values for these nodes. For instance, the processing device samples based on the values that exceed a threshold probability (e.g., likely to occur in an observed dataset), particular predefined values, etc. Then, for each value of the independent nodes, a corresponding set of values are determined for the dependent nodes by sampling the probability distributions for those nodes given the selected value of the independent nodes, where the sampling is based on the same criterion as the sampling of the independent nodes. For instance, if the value of node 404, $N_0$, is $N_0=\alpha_0$, and node 412, $N_2$, is $N_2=\alpha_2$, the probability distribution for node 408, $N_1$, becomes $p(N_1|N_0=\alpha_0, N_2=\alpha_2, N_6=\alpha_6)$ where $\alpha_6$ is a value sampled from the probability distribution $p(N_6|N_2=\alpha_2, N_4=\alpha_4)$ and $\alpha_4$ is a value sampled from the probability distribution $p(N_4|N_2=\alpha_2)$. The probability distribution for node 408 (e.g., $p(N_1|N_0=\alpha_0, N_2=\alpha_2, N_6=\alpha_6)$) is sampled to define a set of values for node 408. This process is repeated for each sampled value of the independent node 404 and node 412. The processing device aggregates the sets of values sampled from the probability distributions of each node into the weighting dataset.

The processing device uses the weighting dataset to define weights for each edge of graph data structure 400. The processing device executes a correlation algorithm such as one based on Pearson's correlation coefficient to define the correlation between pairs of input features based on the values of each feature in the weighting dataset. The processing device uses the correlation coefficient (e.g., a number between −1 meaning no correlation and 1 meaning a high degree of correlation) to define a weighting value for the edge. With the weights assigned to each edge, graph data structure 400 can be used to propagate modifications to one input feature to the dependent input features.

Figure 5:
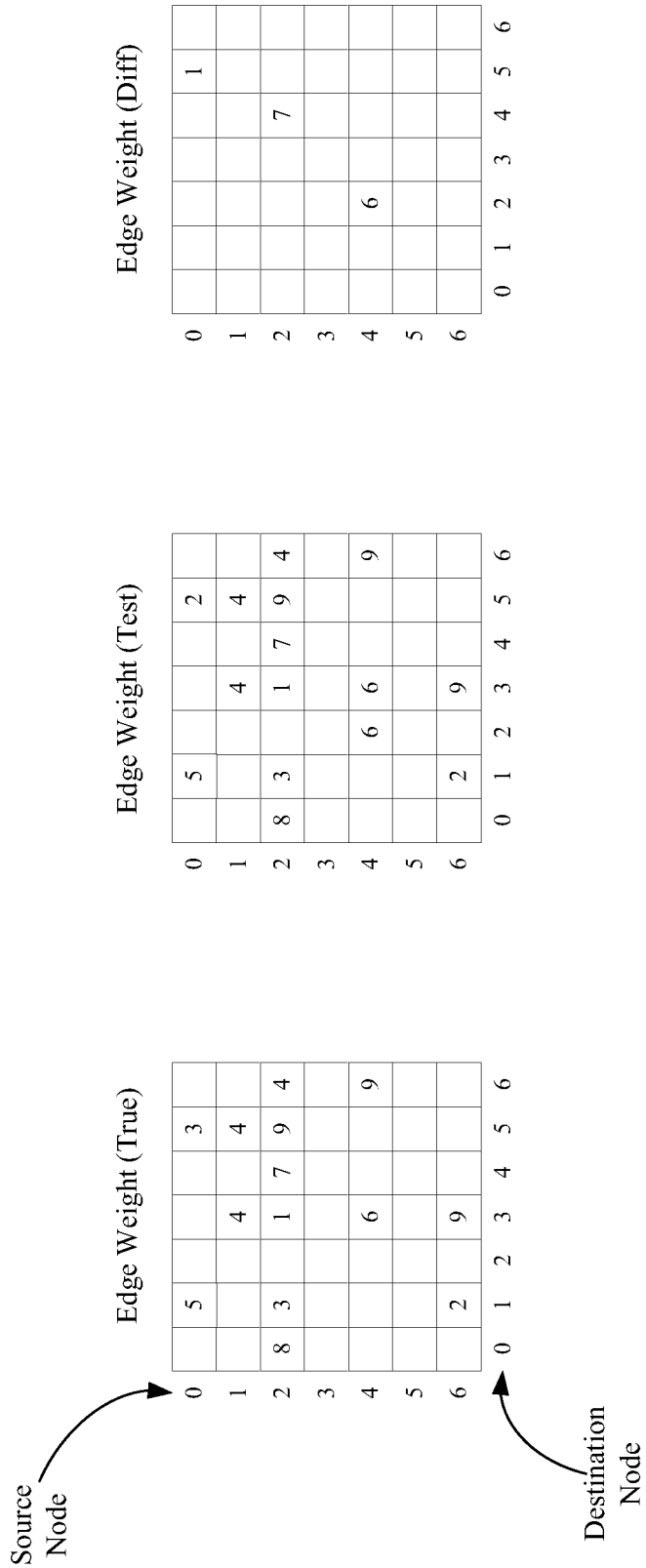
FIG. 5 depicts an example of edge matrices that measure the accuracy of the graph data structure in modeling inter-feature dependencies, according to certain embodiments of the present disclosure.

FIG. 5 depicts an example of edge weight matrices that measure the accuracy of the graph data structure in modeling inter-feature dependencies, according to certain embodiments of the present disclosure. The edge weight matrices depicted are based on the same input dataset that generated graph data structure 400 of FIG. 4. Rows of an edge weight matrix represent a source node and the columns represent a destination nodes such that each cell represents an edge between a source node and a destination node. Each cell of the matrix includes an addressable memory region that stores the weight value of the edge associated with the cell. The processing device uses edge weight matrices 504-512 to measure the accuracy of graph data structures such as graph data structure 400. For instance, if the accuracy (e.g., matrix 512) diverges by more than a threshold amount, the processing device may rebuild the graph data structure using historical data (e.g., the same data used to originally construct graph data structure) or using contemporaneously acquired data.

Edge weight matrices include a cell for each possible pair of linked input features. A blank cell represents a null space in which the two referenced input features are not linked by an edge. In some instances, the diagonal cells (e.g., cell 00, 11, 22, etc.) will also be blank as edges do not link a node to itself. The numerical value assigned to a cell represents the edge weight. Although integers are depicted in FIG. 5, any value may be used such as a real number, a string, a function, a pointer, etc.

Edge weight matrix 504 represents the true edge weights as predetermined based on known correlations in an input dataset. Data processing devices receive the input dataset along with labels that indicate the correlations between input features and the degree in which the input features are correlated. In other words, the input dataset and corresponding labels indicate the nodes, edges, and edge weights for the graph data structure.

Edge weight matrix 508 represents a graph data structure generated using techniques described above in connection to FIG. 3 and FIG. 4. The processing device received the input data, but nothing else, and determined the relationships between the input features and the degree of correlation between the input features for the raw data. The processing device generated a graph data structure based on the observed correlations. The resulting graph data structure is depicted in FIG. 4 and represented by matrix 508.

Delta matrix 512 is an edge weight matrix that represents the delta between the matrix 504 and matrix 508. Since matrix 504 represents the true graph data structure and matrix 508 represents the graph data structure generated from observations using the techniques described above, the delta matrix 512 represents the accuracy of matrix 508 and subsequently the graph data structure generated from the observed correlations of the input dataset. Matrix 512 indicates that the graph data structure of matrix 508 included an edge linking nodes 420 to node 412 and edge linking node 412 to node 420. These edges are not included in matrix 504. In addition, matrix 508 assigned a different weight to the edge linking node 404 to node 428.

Various accuracy algorithms can be used to define an accuracy score for an edge weight matrix. For instance, the cells of the delta matrix 512 can be aggregated into a singular score. In this instance, the score may not take into account the additional/missing edges. In some instances, if matrix 508 includes an edge (or omits an edge) the graph data structure may be re-generated. An extra edge may propagate a modification to an improper input feature corrupting the updated input features. Similarly, an omitted edge will fail to propagate the modification to a dependent input feature corrupting the updated input features and prevent the predictive model from generating accurate predictions.

The processing device generates edge weight matrices from graph data structures and stores them in local (or remote) storage. The processing device can load the edge weight matrix from memory to test the accuracy of the graph data structure at any time. In some instances, the processing device distributes the delta matrix 512 with the predicted outcome. Delta matrix 512 can be used as an accuracy signature that verifies the integrity of the predicted outcome.

Figure 6:
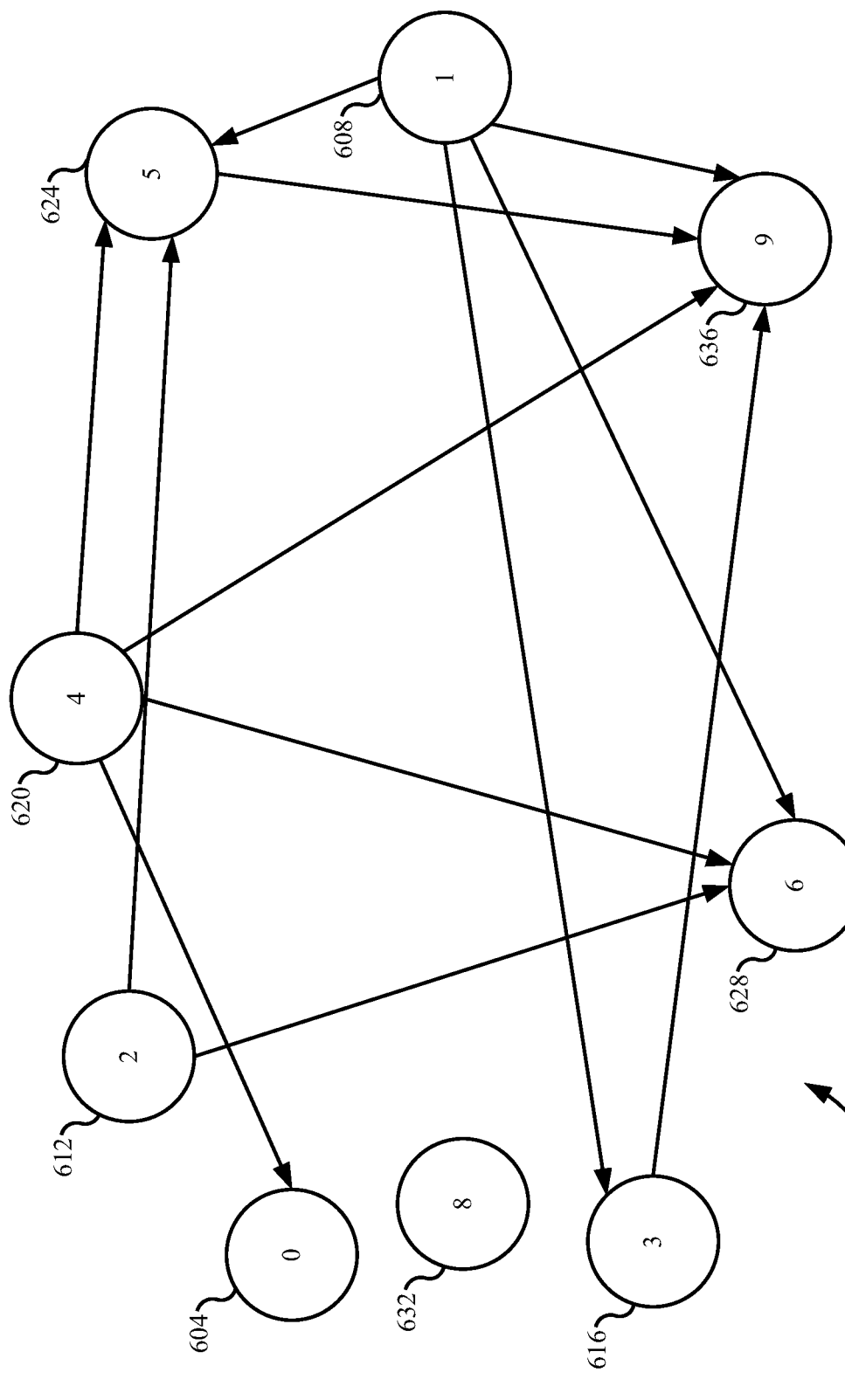
FIG. 6 depicts an example of graph data structure that models the inter-feature dependencies of a set of input features, according to certain embodiments of the present disclosure.

FIG. 6 depicts an example of graph data structure that models the inter-feature dependencies of a set of input features, according to certain embodiments of the present disclosure. Graph data structure 600 represents an input dataset of a marketing system. Graph data structure 600 includes ten nodes with various inter-feature dependencies. Each node can include zero or more edges that link nodes to other nodes. For instance, node 632 is independent and no other nodes are dependent on node 632. Node 608 is also independent in that the value of the input feature represented by node 608 is not dependent on another node.

Nodes 604-636 represent input features of a marketing system for a particular product or service. For instance, node 604 represents travel data, node 608 represents display advertisements (e.g., media distributed or placed in public places), node 612 represents search advertisements, node 616 represents other entities, node 628 represents other products and services offered by the same entity, node 620 represents social media (e.g., types of posts, post content, frequency of posts, location of posts, etc.), node 624 represents promotional email, node 628 represents other products and services offered by the same entity, node 632 represents other webpages such as those associated with competing products or services or related products or services (e.g., number of other webpages, frequency of visits, etc.), and node 636 represents direct information distribution (e.g., advertisements distributed directly to end users, other information associated with the product or service).

Figure 7:
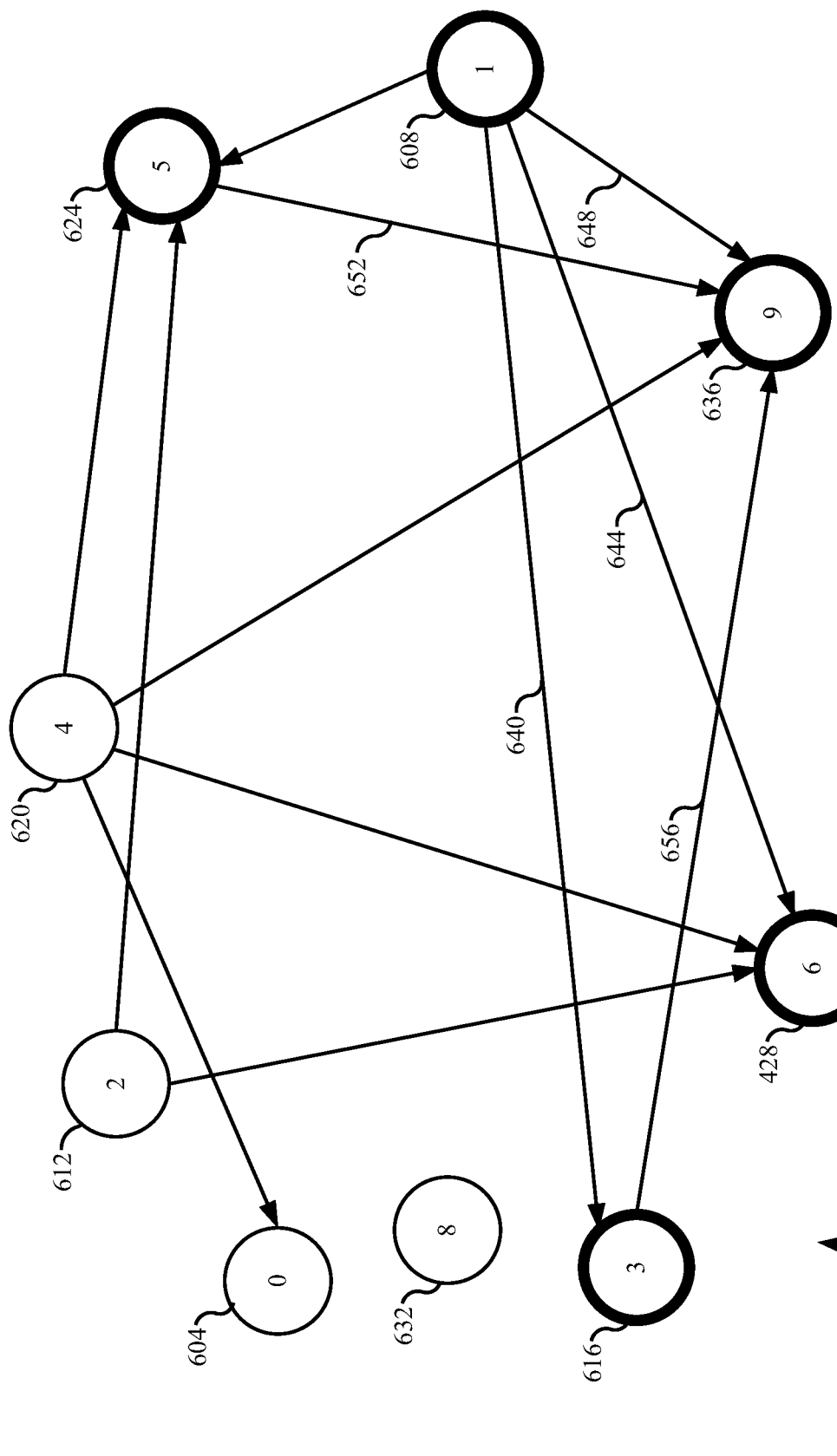
FIG. 7 depicts an example of a modified graph data structure of FIG. 6 based on modification of one or more input features, according to certain embodiments of the present disclosure.

FIG. 7 depicts an example of a modified graph data structure of FIG. 6 based on modification of one or more input features, according to certain embodiments of the present disclosure. Graph data structure 700 is a modified version of graph data structure 600 of FIG. 6 in which two input features are modified and the modifications are propagated to dependent input features. For instance, a processing device receives a request to predict an outcome given a modification to node 608 and node 624. The value of each input is modeled by the function $f(N_i)=\alpha_i$ where i represents a particular node. The value of node 608 prior to the modification is represented by $f(N_1)=\alpha_1$ and after the modification by $f(N_1)=\alpha_1+\Delta\alpha_1$, where $\Delta\alpha_1$ is the modification made to the input feature of node 608. Similarly, the value of node 624 is represented by $f(N_5)=\alpha_5$ before being modified and by $f(N_5)=\alpha_5+\Delta\alpha_5$ after the modification, where $\Delta\alpha_5$ is the modification made to the input feature of node 608.

The processing device uses graph data structure 700 to propagate the modifications of nodes 608 and 624 to nodes 616 (e.g., destination node of node 608), node 628 (e.g., destination node of node 608) and node 636 (e.g., destination node of node 608, 624 and 616). In some instances, a modification to a node prevents the propagation of modifications to that node. For instance, the modification of the input feature associated with node 608, which is a source node to node 624 will not be propagated to node 624 due to the modification of node 624. The value of node 624 as a result of the modification remains, $f(N_5)=\alpha_5+\Delta\alpha_5$) even though node 624 is a destination node to another node with a modified value.

The value of dependent nodes is a function of at least (a) the modification of the input feature and (b) a weight assigned to an edge linking the first input feature to the second input feature within the directed graph. For instance, the processing device represents the value of node 616, which is dependent on node 608 by $f(N_3)=\alpha_3+w_{13}\Delta\alpha_1$ where $w_{13}$ is the weight of edge 640. The processing device represents the value of node 628, which is dependent on node 608 by $f(N_6)=\alpha_6+w_{16}\Delta\alpha_1$ where $w_{16}$ is the weight of edge 644. Node 636 is a destination node that depends on the value of node 608, node 624, and node 616. The processing device represents the value of node 636, by $f(N_9)=\alpha_9+w_{19}\Delta\alpha_1+w_{59}\Delta\alpha_5+w_{39}\Delta\alpha_3$ where $w_{19}$ is the weight of edge 648, $w_{59}$ is the weight of edge 652, $w_{39}$ is the weight of edge 656, and $\Delta\alpha_3=w_{13}\Delta\alpha_1$. The processing device represents the value of destination nodes (of a modified source node) as $f(N_i)=\alpha_i+w_{ji}\Delta\alpha_j$, where i represents the destination node and represents the source node.

Figure 8:
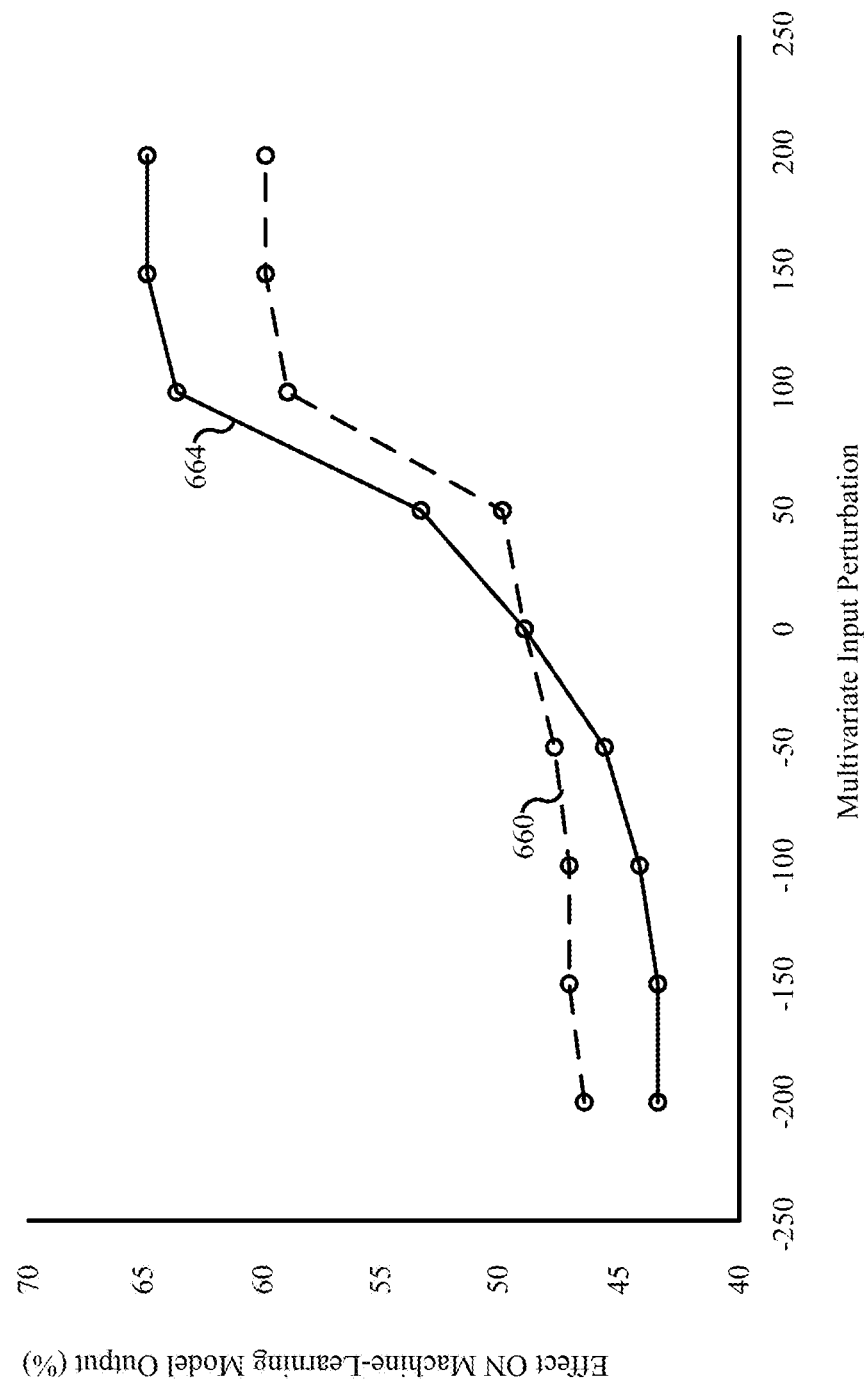
FIG. 8 depicts an example graph representing the effect of modifications to two input features on the predicted outcome, according to certain embodiments of the present disclosure.

FIG. 8 depicts an example graph representing the effect of modifications to two input features as described in FIG. 7 on the predicted outcome, according to certain embodiments of the present disclosure. The dotted line 660 represents an application of the machine-learning model to an input feature set in which modifications are not propagated (e.g., a static approach) to dependent input features. The solid line 664 represents an application of the machine-learning model to an input feature set in which modifications are propagated (e.g., a propagation approach) to dependent input features. At x=0, the predicted outcome using a propagation approach or static approach are the same.

For x>0, the propagation approach includes higher value of the predicted outcome. This is due to the increase in the two modified input features causing an increase in the value of dependent input feature. For x<0, the propagation approach includes lower predicted outcomes from the static approach due to the lower values further decreasing the values of dependent input features. As the absolute value of x increases, the difference between the propagation approach and the static approach increases due to the larger modification causing a larger variation in the predictive outcome. The variation between the static approach and the propagation approach at higher absolute values of x, indicate that the static approach has a higher error rate with larger modifications to input features. A processing device utilizing the propagation approach generates updated input features (resulting from modifications of one or more input features) with lower error rates and higher accuracy over the static approach.

Figure 9:
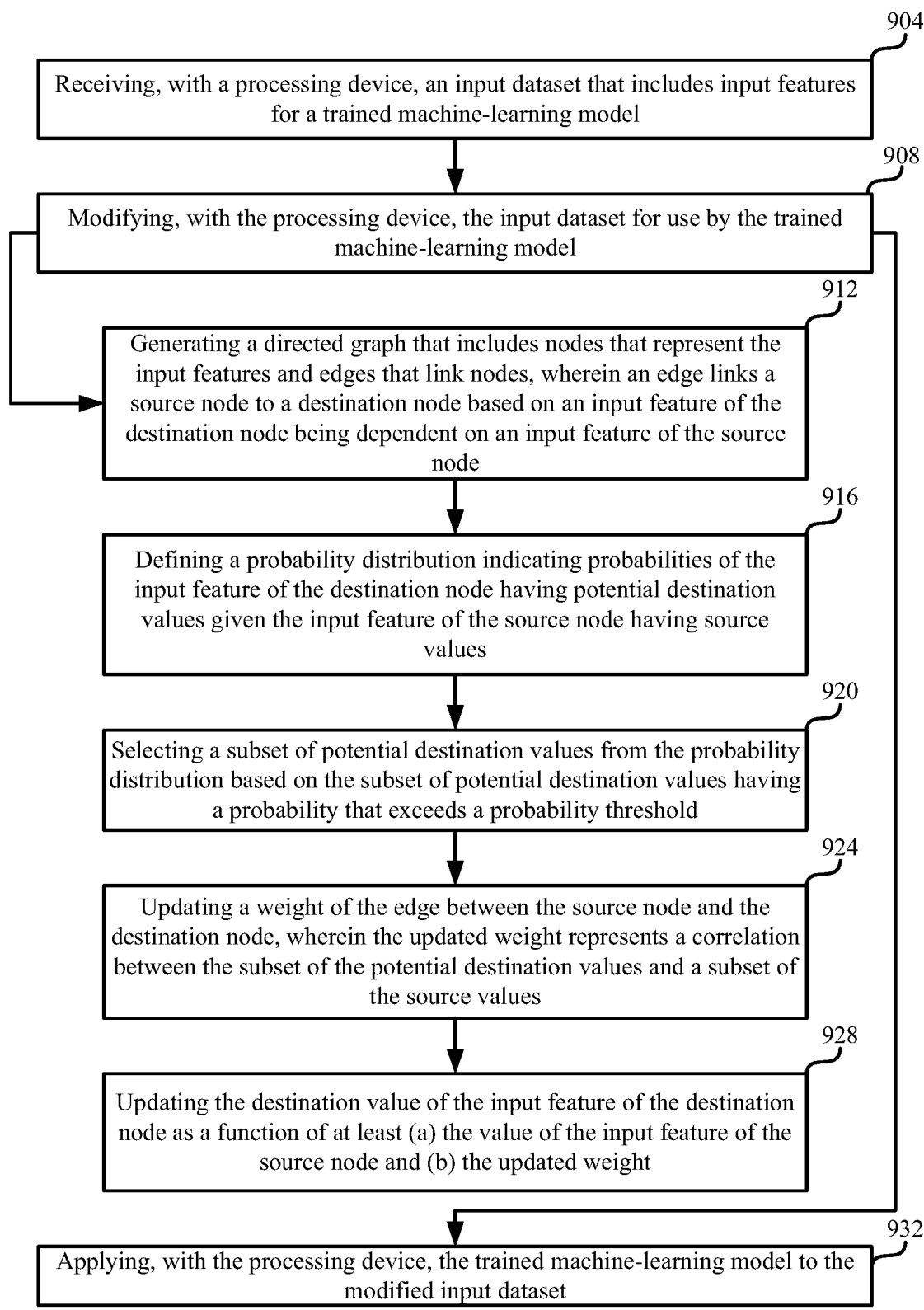
FIG. 9 depicts an example of a process for predicting the probability of an outcome resulting from variance of one or more input features, according to certain embodiments of the present disclosure.

FIG. 9 depicts an example of a process predicting the probability of an outcome resulting from variance of one or more input features, according to certain embodiments of the present disclosure. At block 904 a processing device receives an input dataset that includes input features for a trained machine-learning model. The processing device receives the input dataset from local storage or from a remote device such as a server or network accessible database. In some instances, the processing device receives a request to execute a simulation of a scenario with an identification of the data to use for the simulation. The scenario can include modified values for a first input feature to predict an outcome that will result as a result of the modification. In response to the request, the processing device accesses the input dataset that correspond to the identification (e.g., using a remote procedure call to a database, etc.).

At block 908, the processing device modifies the input dataset by propagating modification to the first input feature to a second input feature dependent on the first input feature. Modifying the input dataset includes blocks 912-928.

At block 912, the processing device generates a directed graph that includes nodes that represent the input features and edges that link pairs of nodes. The edges are directed to indicate that a second input feature represented by a destination node is dependent on a first input feature represented by a source node. The directed graph may be a directed acyclic graph. The processing device generates the directed graph using continuous optimization in which a graph of nodes representing input features is initialized. The processing device iteratively modifies the graph by adding, removing, or reversing a directed edge and then determining a score of the resulting modification. If the score increases, the modification is retained. If the score decreases, the modification is discarded. The processing device continuously optimizes the directed graph until the score exceeds a threshold value or the score no longer increases between iterations.

The score may be based on correlations observed from the input dataset and/or historical datasets. For instance, a correlation can be observed when the value of an input features increases when another value of an input feature increases. In some instances, the processing device defines a correlation coefficient that defines relationships between two or more input features. The coefficient can be a value between −1 (e.g., no correlation) and 1 (e.g., high correlation). Adding an edge between two correlated input features (e.g., a correlation coefficient between 0 and 1) causes a positive score (e.g., which is equal to the correlation coefficient, proportional to the correlation coefficient, equal to some other positive value, etc.).

At block 916, the processing device defines a probability distribution for each input feature taking into account the dependencies identified by the directed graph. Probability distributions indicate, for independent input features, a probability that the input feature will be a particular value, and for dependent input features, a probability that the input feature will be a particular value given a value of another input feature. For instance, the first (and independent) input feature is represented by $p(N_1)$ and the input feature is represented by $p(N_2|N_1)$. The probability of values can be determined from generated data (randomized data), from the input dataset, and/or from historical datasets.

At block 920, the processing device selects a subset of potential destination values from the probability distribution of the second input device based on the subset of potential destination values having a probability that exceeds a probability threshold. For instance, the probability distributions of each of the first input feature and the second input feature can be sampled to generate a weighting dataset. The processing device samples the probability distribution of the first input feature by selecting values for the first input feature that exceed a probability threshold. The processing device samples the probability distribution of the second input feature by selecting values for the first input feature (e.g., the sampled values). For instance, since the probability distribution for the second is represented by $p(N_2|N_1)$, the processing device samples the probability distribution of second input feature by $p(N_2|N_1=x$, where x is a sampled value of the first input feature. The sampled values from the probability distribution of the first and second input features are aggregated into a weighting dataset.

At block 924, the processing device updates a weight of the edge between the source node and the destination node. The processing device uses the weighting dataset to define correlations between the input features connected by an edge. The processing device assigns edge linking nodes with a high degree of correlation with a higher value than edge linking nodes with a low degree of correlation. In some instances, the processing device uses the degree of correlation to add new edges, remove existing edges, or revise edges. For instance, if a degree of correlation between two input features is low (e.g., less than zero), then the edge may be removed. In other instances, the processing device rebuilds the directed graph in response to a low degree of correlation between two input features.

At block 928, the processing device updates the destination value of the second input feature as a function of at least (a) the value of the input feature of the source node and (b) the updated weight. The destination value (e.g., the value of destination nodes that are dependent on source nodes) is modified as the result of the modification to the first input feature of the input dataset. For instance, the processing device executes a simulation of a scenario in which the machine-learning model predicts an outcome resulting from an increase/decrease in the first input feature. The processing propagates the modification to the first input feature to the second input feature based on the dependency of the second input feature on the first input features. The value of the updated second input feature is $f(N_2)=\alpha_2+w_{12}\Delta\alpha_1$, where $w_{12}$ is the edge weight of the edge linking the first input feature to the second input feature, and $\Delta\alpha_1$ is the modification to the first input feature. Once the values of modified input features are set, the values remain unchanged during graph traversal (e.g., during propagation of the modifications to the input features).

For instance, the graph data structure of FIG. 7 illustrates a modification to node 604 and node 624. The modified value of node 624 remains static even if the node 624 is dependent on node 608. That is, the propagation of the modification to the value of the input node represented by node 608 would modify the value of the input feature represented by node 624. Yet, since node 624 was modified as per the scenario (in this example), the value of the value of the input feature represented by node 624 remains equal to the modification (as originally defined by the scenario).

At block 932, the processing device applies a trained machine-learning model on the modified input dataset. The machine-learning model may be any type of machine-learning model trained in any particular manner (e.g., supervised learning, semi-supervised learning, or unsupervised learning). The machine-learning model can be a predictive model that predicts an outcome (or a probability of an outcome's occurrence) based on the input features. The outcome can be compared to a previous outcome (e.g., such as a baseline outcome) to determine a degree in which the modification of the first input feature increased/decreased the outcome.

The process device defines multiple scenarios to iteratively test the sensitivity of the outcome to particular input features. For instance, the scenarios may modify one input feature at a time to determine which input features had a greater effect on the outcome. The processing device can then rank the input features. The ranked list of input features can be output along with the outcome.

In some instances, the outcome of the machine-learning model can be displayed via the graphical user interface of a display device. The graphical user interface receives input defining simulations or scenarios and automatically displays the predicted outcome based on the scenario. Previous simulations or scenarios can be displayed with the current simulations or scenarios.

The blocks of FIGS. 3 and 9, though presented in a particular order, may be executed in any particular order. In addition, each block of FIG. 3 or FIG. 9 may be executed one or more times before moving on to the next block.

Example of a Computing System for Implementing Certain Embodiments

Figure 10:
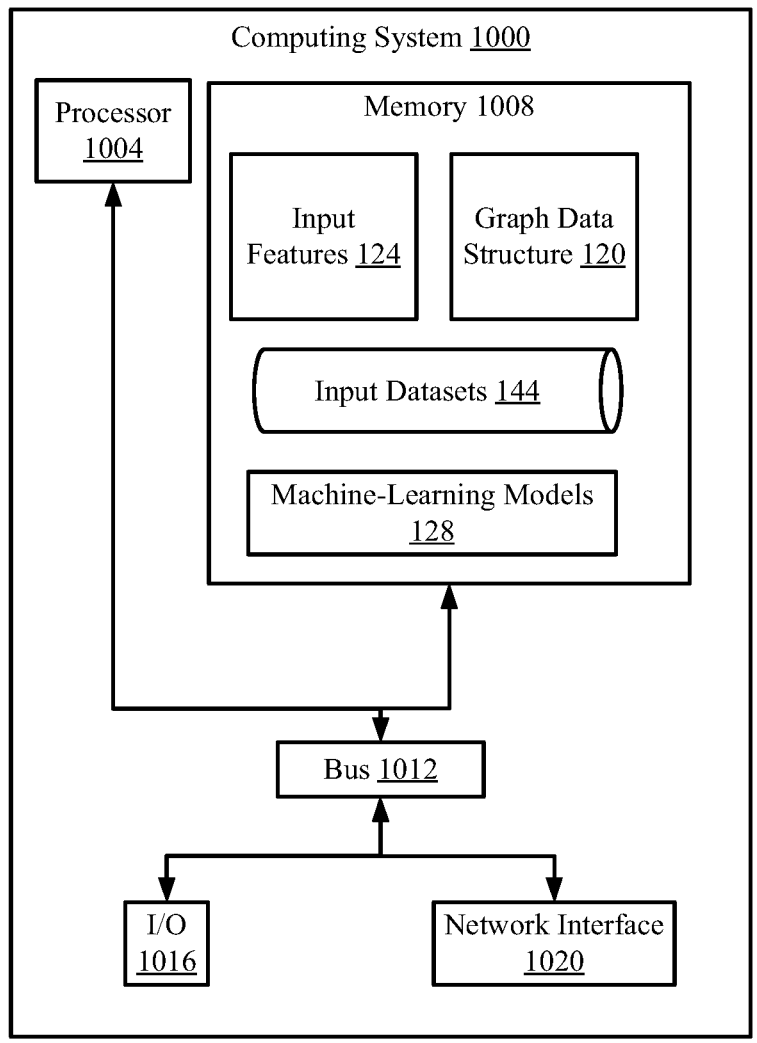
FIG. 10 depicts an example of a computing system that performs certain operations described herein, according to certain embodiments of the present disclosure.

Any suitable computing system or group of computing systems can be used for performing the operations described herein. For example, FIG. 10 depicts examples of computing system 1000 that executes market simulations. In some embodiments, the computing system 1000 generates graph data structure 120 that is used to define input features 124 for particular scenarios, as depicted in FIG. 10. In other embodiments, graph data structure may be generated by a separate computing device.

The depicted examples of a computing system 1000 includes a processor 1004 communicatively coupled to one or more memory devices 1008. The processor 1004 executes computer-executable program code stored in a memory device 1008, accesses information stored in the memory device 1008, or both. Examples of the processor 1004 include a microprocessor, an application-specific integrated circuit ("ASIC"), a field-programmable gate array ("FPGA"), or any other suitable processing device. The processor 1102 can include any number of processing devices, including a single processing device.

The memory device 1008 includes any suitable non-transitory computer-readable medium for storing data, program code, or both. A computer-readable medium can include any electronic, optical, magnetic, or other storage device capable of providing a processor with computer-readable instructions or other program code. Non-limiting examples of a computer-readable medium include a magnetic disk, a memory chip, a ROM, a RAM, an ASIC, optical storage, magnetic tape or other magnetic storage, or any other medium from which a processing device can read instructions. The instructions may include processor-specific instructions generated by a compiler or an interpreter from code written in any suitable computer-programming language, including, for example, C, C++, C#, Visual Basic, Java, Python, Perl, JavaScript, and ActionScript.

The computing system 1000 may also include a number of external or internal devices, such as input or output devices. For example, the computing system 1000 is shown with one or more input/output ("I/O") interfaces 1016. An I/O interface 1016 can receive input from input devices or provide output to output devices. One or more buses 1012 are also included in the computing system 1000. The bus 1012 communicatively couples one or more components of a respective one of the computing system 1000.

The computing system 1000 executes program code that configures the processor 1102 to perform one or more of the operations described herein. The program code includes, for example, the machine-learning models 128, code that updates input features to correspond to a particular scenario, code for generating directed graphs, or other suitable applications that perform one or more operations described herein. The program code may be resident in the memory device 1008 or any suitable computer-readable medium and may be executed by the processor 1004 or any other suitable processor. In some embodiments, the program code can execute in a cloud environment where portions of the program code are executed by multiple devices in parallel.

The computing system 1000 can access input datasets 144 and the graph data structure 120 in any suitable manner. In some embodiments, some or all of one or more of these datasets, models, and functions are stored in the memory device 1008, as in the example depicted in FIG. 10. For example, a computing system 1000 that executes the machine-learning model 128 to predict an outcome can obtain the input datasets 120 and use the graph data structure to generate updated input features 124 within memory 1008.

In additional or alternative embodiments, one or more of these datasets, models, and functions are stored in the same memory device (e.g., one of the memory device 1104). For example, a common computing system, such as the processing device 104 depicted in FIG. 1, can host the machine-learning models 128 and the graph data structure 120. In additional or alternative embodiments, one or more of the programs, datasets, models, and functions described herein are stored in one or more other memory devices accessible via a data network.

The computing system 1000 also includes a network interface device 1020. The network interface device 1020 includes any device or group of devices suitable for establishing a wired or wireless data connection to one or more data networks. Non-limiting examples of the network interface device 1020 include an Ethernet network adapter, a modem, and the like. The computing system 1000 is able to communicate with one or more other computing devices (e.g., server 136 that directs the operations of processing device 103) via a data network using the network interface device 1020.

General Considerations

Numerous specific details are set forth herein to provide a thorough understanding of the claimed subject matter. However, those skilled in the art will understand that the claimed subject matter may be practiced without these specific details. In other instances, methods, apparatuses, or systems that would be known by one of ordinary skill have not been described in detail so as not to obscure claimed subject matter.

Unless specifically stated otherwise, it is appreciated that throughout this specification discussions utilizing terms such as "processing," "computing," "calculating," "determining," and "identifying" or the like refer to actions or processes of a computing device, such as one or more computers or a similar electronic computing device or devices, that manipulate or transform data represented as physical electronic or magnetic quantities within memories, registers, or other information storage devices, transmission devices, or display devices of the computing platform.

The system or systems discussed herein are not limited to any particular hardware architecture or configuration. A computing device can include any suitable arrangement of components that provide a result conditioned on one or more inputs. Suitable computing devices include multi-purpose microprocessor-based computer systems accessing stored software that programs or configures the computing system from a general purpose computing apparatus to a specialized computing apparatus implementing one or more embodiments of the present subject matter. Any suitable programming, scripting, or other type of language or combinations of languages may be used to implement the teachings contained herein in software to be used in programming or configuring a computing device.

Embodiments of the methods disclosed herein may be performed in the operation of such computing devices. The order of the blocks presented in the examples above can be varied—for example, blocks can be re-ordered, combined, and/or broken into sub-blocks. Certain blocks or processes can be performed in parallel.

The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included herein are for ease of explanation only and are not meant to be limiting.

While the present subject matter has been described in detail with respect to specific embodiments thereof, it will be appreciated that those skilled in the art, upon attaining an understanding of the foregoing, may readily produce alterations to, variations of, and equivalents to such embodiments. Accordingly, it should be understood that the present disclosure has been presented for purposes of example rather than limitation, and does not preclude the inclusion of such modifications, variations, and/or additions to the present subject matter as would be readily apparent to one of ordinary skill in the art.

The invention claimed is:

1. A method for multivariate machine-learning simulations, the method comprising:
receiving, with a processing device, an input dataset comprising marketing data for a marketing simulation performed by a trained machine-learning model, wherein the input dataset includes input features describing aspects of a marketing scenario to be simulated using the marketing simulation;
modifying, with the processing device, the input dataset for use by the trained machine-learning model, wherein modifying the input dataset comprises:
  initiating a directed acyclic graph that includes nodes representing the input features and initially omits edges;
  iteratively modifying the directed acyclic graph while determining a correlation coefficient for two or more of the input features in the directed acyclic graph subject to modification, wherein the correlation coefficient defines a relationship between the two or more of the input features;
  maintaining edges between pairs of input features in response to an increase in a score determined by the correlation coefficient to generate the directed acyclic graph including nodes and the edges that link the nodes, wherein an edge links a source node to a destination node based on an input feature of the destination node being dependent on an input feature of the source node as indicated by the increase in the score,
  defining a probability distribution indicating probabilities of the input feature of the destination node having potential destination values given the input feature of the source node having source values,
  selecting a subset of potential destination values from the probability distribution based on the subset of potential destination values having a probability that exceeds a probability threshold, wherein the probability threshold is configured to determine potential destination values of the input features corresponding to a user action being more likely than not to occur,
  updating a weight of the edge between the source node and the destination node, wherein the updated weight represents a correlation between destination marketing inputs represented by the subset of the potential destination values and source marketing inputs represented by a subset of the source values, and
  updating a destination value of the input feature of the destination node as a function of at least (a) a value of the input feature of the source node and (b) the updated weight; and
applying, with the processing device, the trained machine-learning model to the modified input dataset to produce a predictive output based on the marketing data.

2. The method of claim 1, further comprising:
receiving, by the processing device, a request to modify a first input feature represented by the source node;
updating the source node to include a new source value based on the request; and
modifying, with the processing device, the destination value of the destination node linked to the source node based on the new source value and the updated weight.

3. The method of claim 2, further comprising:
modifying a subsequent value of a subsequent node linked to the destination node by a subsequent edge based on the destination value and a weight of the subsequent edge linking the destination node and the subsequent node.

4. The method of claim 1, wherein the trained machine-learning model is configured to determine whether a modification to one or more of the input features increased or decreased the probability relative to the probability threshold.

5. The method of claim 1, wherein generating the directed acyclic graph includes:
executing a sensitivity analysis using the trained machine-learning model; and determining, based on the sensitivity analysis, a sensitivity metric of a first input feature that indicates how sensitive an output of the trained machine-learning model is to the first input feature; and modifying, by the processing device, the first input feature based on the sensitivity analysis.

6. The method of claim 1, further comprising:

ranking, based on applying the trained machine-learning model to the modified input dataset, the input features based on a degree in which each input feature affected a prediction of the trained machine-learning model.

7. A system for multivariate machine-learning simulations, the system comprising:

one or more processors; and a non-transitory computer-readable medium including instructions that when executed by the one or more processors, cause the one or more processors to perform operations including:

receiving, with a processing device, an input dataset comprising marketing data for a marketing simulation performed by a trained machine-learning model, wherein the input dataset includes input features describing aspects of a marketing scenario to be simulated using the marketing simulation;

modifying, with the processing device, the input dataset for use by the trained machine-learning model, wherein modifying the input dataset comprises:

initiating a directed acyclic graph that includes nodes representing the input features and initially omits edges;

iteratively modifying the directed acyclic graph while determining a correlation coefficient for two or more of the input features in the directed acyclic graph subject to modification, wherein the correlation coefficient defines a relationship between the two or more of the input features;

maintaining edges between pairs of input features in response to an increase in a score determined by the correlation coefficient to generate the directed acyclic graph including nodes and the edges that link the nodes, wherein an edge links a source node to a destination node based on an input feature of the destination node being dependent on an input feature of the source node as indicated by the increase in the score, defining a probability distribution indicating probabilities of the input feature of the destination node having potential destination values given the input feature of the source node having source values, and selecting a subset of potential destination values from the probability distribution based on the subset of potential destination values having a probability that exceeds a probability threshold, wherein the probability threshold is configured to determine potential destination values of the input features corresponding to a user action being more likely than not to occur, updating a weight of the edge between the source node and the destination node, wherein the updated weight represents a correlation between destination marketing inputs represented by the subset of the potential destination values and source marketing inputs represented by a subset of the source values, and updating a destination value of the input feature of the destination node as a function of at least (a) a value of the input feature of the source node and (b) the updated weight; and applying, with the processing device, the trained machine-learning model to the modified input dataset to produce a predictive output based on the marketing data.

8. The system of claim 7, wherein the operations further include:

receiving, by the processing device, a request to modify a first input feature represented by the source node;

updating the source node to include a new source value based on the request; and modifying, with the processing device, the destination value of the destination node linked to the source node based on the new source value and the updated weight.

9. The system of claim 8, wherein the operations further include:

modifying a subsequent value of a subsequent node linked to the destination node by a subsequent edge based on the destination value and a weight of the subsequent edge linking the destination node and the subsequent node.

10. The system of claim 7, wherein the trained machine-learning model is configured to determine whether a modification to one or more of the input features increased or decreased the probability relative to the probability threshold.

11. The system of claim 7, wherein generating the directed acyclic graph includes:

executing a sensitivity analysis using the trained machine-learning model; and determining, based on the sensitivity analysis, a sensitivity metric of a first input feature that indicates how sensitive an output of the trained machine-learning model is to the first input feature; and modifying, by the processing device, the first input feature based on the sensitivity analysis.

12. The system of claim 7, wherein the operations further include:

ranking, based on applying the trained machine-learning model to the modified input dataset, the input features based on a degree in which each input feature affected a prediction of the trained machine-learning model.

13. A non-transitory computer-readable medium including instructions that when executed by one or more processors, cause the one or more processors to perform operations including:

receiving, with a processing device, an input dataset comprising marketing data for a marketing simulation performed by a trained machine-learning model, wherein the input dataset includes input features describing aspects of a marketing scenario to be simulated using the marketing simulation;

modifying, with the processing device, the input dataset for use by the trained machine-learning model, wherein modifying the input dataset comprises:

initiating a directed acyclic graph that includes nodes representing the input features and initially omits edges;

iteratively modifying the directed acyclic graph while determining a correlation coefficient for two or more of the input features in the directed acyclic graph subject to modification, wherein the correlation coefficient defines a relationship between the two or more of the input features;

maintaining edges between pairs of input features in response to an increase in a score determined by the correlation coefficient to generate the directed acyclic graph including nodes and the edges that link the nodes, wherein an edge links a source node to a destination node based on an input feature of the destination node being dependent on an input feature of the source node as indicated by the increase in the score, defining a probability distribution indicating probabilities of the input feature of the destination node having potential destination values given the input feature of the source node having source values, and selecting a subset of potential destination values from the probability distribution based on the subset of potential destination values having a probability that exceeds a probability threshold, wherein the probability threshold is configured to determine potential destination values of the input features corresponding to a user action being more likely than not to occur, updating a weight of the edge between the source node and the destination node, wherein the updated weight represents a correlation between destination marketing inputs represented by the subset of the potential destination values and source marketing inputs represented by a subset of the source values, and updating a destination value of the input feature of the destination node as a function of at least (a) a value of the input feature of the source node and (b) the updated weight; and applying, with the processing device, the trained machine-learning model to the modified input dataset to produce a predictive output based on the marketing data.

14. The non-transitory computer-readable medium of claim 13, wherein the operations further include:

receiving, by the processing device, a request to modify a first input feature represented by the source node;

updating the source node to include a new source value based on the request; and modifying, with the processing device, the destination value of the destination node linked to the source node based on the new source value and the updated weight.

15. The non-transitory computer-readable medium of claim 14, wherein the operations further include:

modifying a subsequent value of a subsequent node linked to the destination node by a subsequent edge based on the destination value and a weight of the subsequent edge linking the destination node and the subsequent node.

16. The non-transitory computer-readable medium of claim 13, wherein the trained machine-learning model is configured to determine whether a modification to one or more of the input features increased or decreased the probability relative to the probability threshold.

17. The non-transitory computer-readable medium of claim 13, wherein generating the directed acyclic graph includes:

executing a sensitivity analysis using the trained machine-learning model; and determining, based on the sensitivity analysis, a sensitivity metric of a first input feature that indicates how sensitive an output of the trained machine-learning model is to the first input feature; and modifying, by the processing device, the first input feature based on the sensitivity analysis.

\* \* \* \* \*